FRANK BRUNETTO
INVENTOR.

BY AGENT,
Arthur L. Bowers
Max L. Farmer
ATTORNEY

FRANK BRUNETTO
INVENTOR.
BY AGENT
Arthur L. Bowers
Max L. Farmer
ATTORNEY

United States Patent Office 3,289,081
Patented Nov. 29, 1966

3,289,081
TEST CIRCUIT FOR DETERMINING OPERATING PARAMETERS OF A GATE TURN-OFF SOLID STATE SWITCH

Frank Brunetto, Brooklyn, N.Y., assignor to the United States of America as represented by the Secretary of the Navy Filed Feb. 27, 1963, Ser. No. 261,548
3 Claims. (Cl. 324—158)

Figure 1:
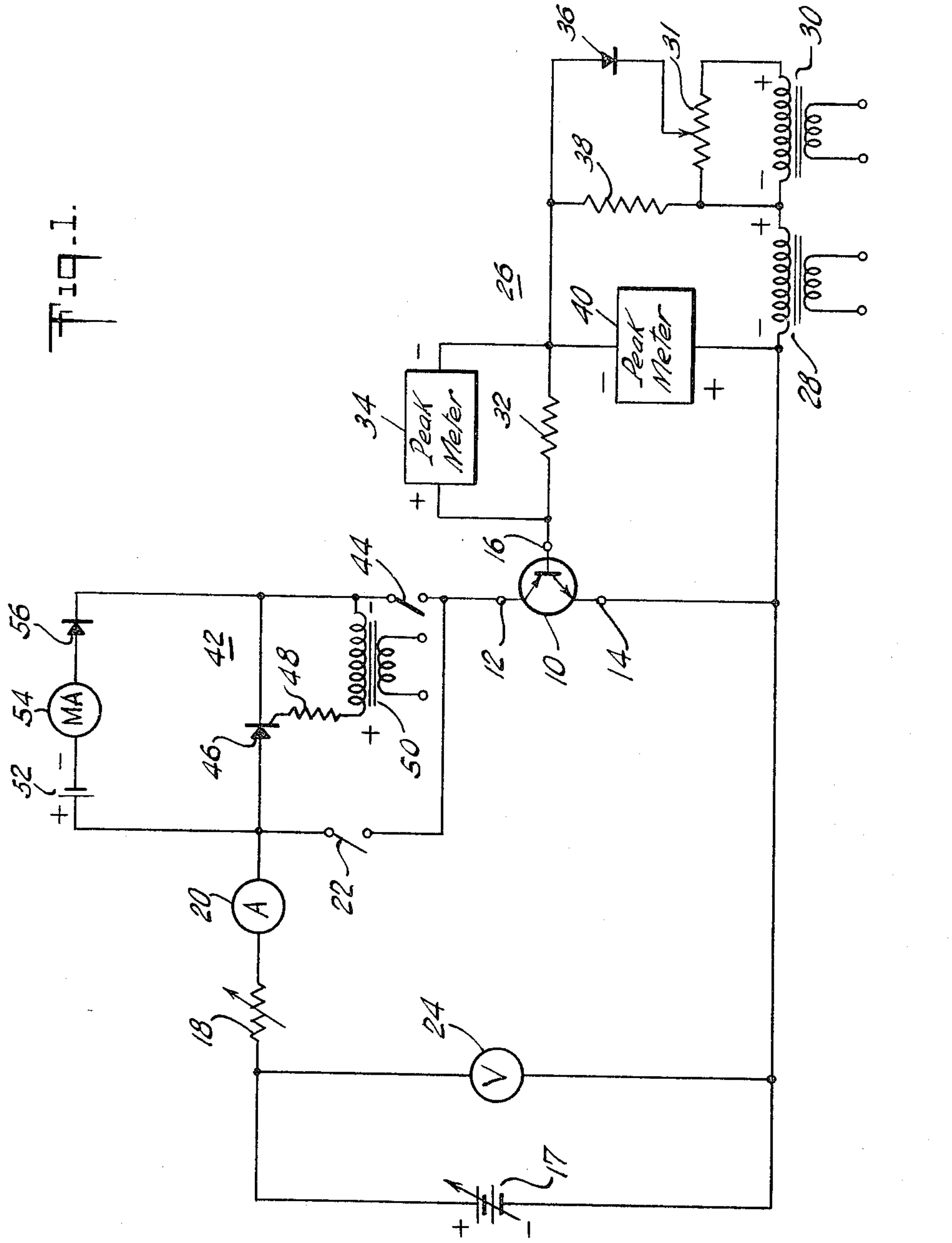

The invention described herein may be manufactured and used by or for the Government of the United States of America for governmental purposes without the payment of any royalties thereon or therefor.

This invention relates to measuring dynamically functional parameters of a gate turn-off solid state switch device.

The gate turn-off switch is a PNPN solid state switching device capable of controlling D.C. as well as A.C. power. Due to the ability of this device to control D.C. power, plus its small size, efficiency, and simplicity of operation, the gate turn-off switch shows promise of becoming more popular than its already popular sister device, the silicon controlled rectifier which is the solid state counterpart of the thyratron. The gate turn-off switch and the silicon controlled rectifier each have an anode, a cathode, and a gate. Both are much like ordinary rectifiers which have been modified to block in the forward direction until a small positive signal is applied to the gate relative to the cathode. After the gate signal is applied, while the anode is positive relative to the cathode, both the gate turn-off switch and the silicon controlled rectifier conduct in the forward direction with a forward characteristic very similar to an ordinary silicon rectifier and will continue to conduct even after the gate-cathode signal is terminated, provided the anode-cathode current exceeds a minimum level termed the holding current. The similarity between the gate turn-off switch and the gate controlled rectifier ends here. The conducting state once initiated in the silicon controlled rectifier cannot be terimnated except by interrupting the anode-cathode circuit or reducing the anode-cathode current below the holding current. In the gate turn-off switch, the conducting state can be terminated by applying a negative signal to the gate relative to the cathode and need be only of a few microseconds duration.

The gate turn-off solid state switch is supplied commercially by a number of manufacturers among which are—General Electric, Westinghouse, Texas Instruments, and Solid State Products. A brief article on this device is included on pages 63 and 64 of Electronic Equipment Engineering, January 1963, Volume II, Number 1, published by Mactier Publishing Company, New York, New York.

Like any other semiconductor device, the gate turn-off switch device is sensitive to temperature variations. A rise in temperature increases the turn-on gain but reduces the turn-off gain of the device. Gain relates to the ratio of load to signal amplitude. A relatively high junction temperature may reduce the turn-off gain to a point where turn-off becomes unattainable, because the apparent turn-off current and turn-off voltage becomes so high that they exceed the rated maximum and may destroy the device. It is important therefore that the gate turn-off switch device be operated within the temperature limits prescribed by the manufacturer which, for silicon, are usually between 150° C. and −65° C. junction temperature. It is also helpful to ascertain the relationship between temperature and the turn-off current and turn-off voltage and forward leakage current.

I have discovered that, generally, there is a smaller turn-off current gain when using a triggering signal with a faster rise time because of the occurrence in the load circuit of higher peaking transient voltage and current. The transients are generated during turn-off by the rapid interruption of the load current. The transient amplitudes are directly proportional to the rate of decay of the load current. The latter, in turn, is directly dependent upon the rise time of the triggering voltage.

The transient voltages are at their minimum when little or no inductance is present in the load circuit. If the load circuit has little or no inductance and it is desired that the turn-off voltage, not the turn-off current, be kept at a minimum, the triggering signal rise time should be fast. Therefore, there is a need for ascertaining the relationship of the peak amplitude of the turn-off current and the turn-off voltage to trigger signal rise time and for various load circuit conditions.

I have discovered also that the magnitude of the load supply voltage has far more significant influence on the turn-off parameters of a gate turn-off switch device than the influence of junction temperature and triggering signal rise time. Differences of as much as 100% in turn-off current and much more in turn-off voltage may occur with substantially differing load supply voltages. Higher supply voltage in the load circuit requires more turn-off power because the switch device must attain higher internal resistance for an equivalent reduction in load current. To illustrate, assume two circuits each including a gate turn-off switch. In one circuit assume the supply voltage is 10 volts, the load resistance is 9 ohms and the load current is 1 ampere; therefore the anode-cathode voltage drop is 1 volt which corresponds to an internal resistance of 1 ohm. In the other circuit, assume the supply voltage is 100 volts, the load resistance is 99 ohms and the load current is the same as above, 1 ampere; therefore the anode-cathode voltage drop is 1 volt which corresponds to an internal resistance of 1 ohm. However, the anode-cathode resistances in the two cases become vastly different once the process of turn-off is initiated. Assuming the load current drops to .9 ampere, the anode-cathode voltage drop in the circuit with the lower supply voltage rises to 1.9 volts while the anode-cathode voltage drop in the circuit with the higher supply voltage rises to 10.9 volts.

Assuming turn-off is a continuous reduction in load current brought about by a corresponding increase in load circuit resistance, the gate turn-off switch must attain a substantially higher internal resistance in a circuit with greater supply voltage for an equivalent drop in load current. This can only be accomplished by the application of more negative power on the gate, a method analogous to imposing a more negative voltage on the control grid of a vacuum tube. The same applies if the supply voltage is unregulated. Therefore there is a need for ascertaining the relationship of load circuit supply voltage to turn-off current relationship and turn-off voltage.

An object of this invention is to provide an apparatus and method for determining turn-off current, turn-off voltage, turn-on current, and turn-on voltage, and forward leakage current of a gate turn-off solid state switch device under various dynamic conditions and to ascertain these functional parameters in a way that can be duplicated for repeatable results.

A further object is to provide a practical, efficient, reliable, comparatively inexpensive apparatus and method for easily, quickly, and accurately determining important functional parameters of a gate turn-off switch device.

Other objects and advantages will appear from the following description of an example of the invention, and the novel features will be particularly pointed out in the appended claims.

Figure 2:
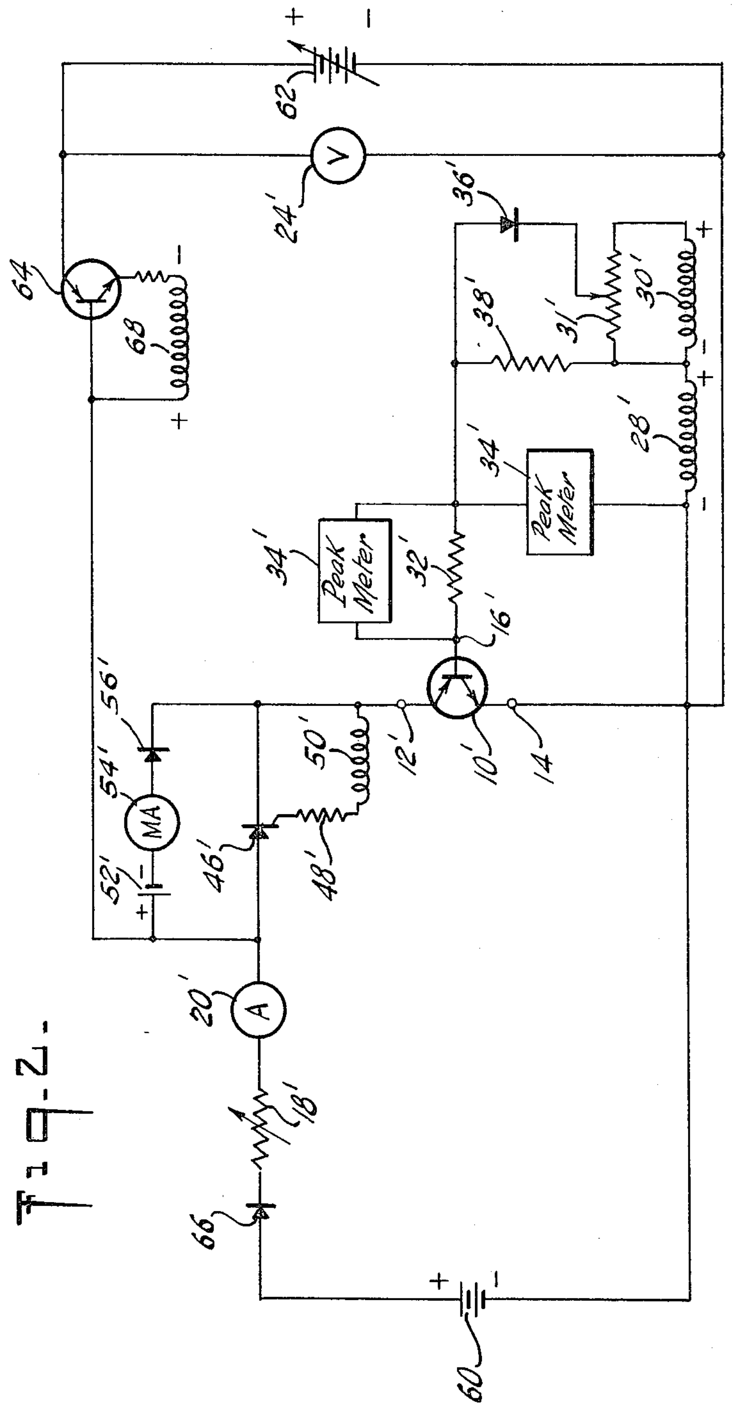
Figure 4:
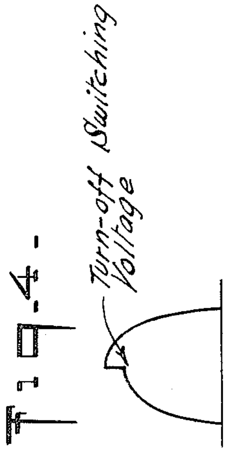
Figure 3:
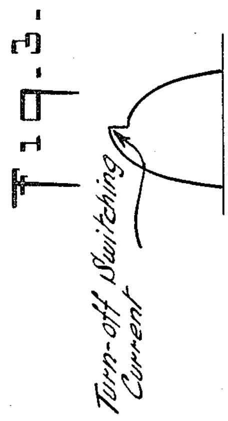

FIGS. 1 and 2 are schematic circuit diagrams of two embodiments of this invention, and FIGS. 3 and 4 are current and voltage waveforms in the gating circuit.

In FIG. 1, there is shown a switch device 10 of the type described in place in a test circuit in accordance with this invention and having an anode terminal 12, a cathode terminal 14, and a gate terminal 16 connected to the corresponding elements of the switch device. Connected in series with anode terminal 12 and cathode terminal 14 is a circuit branch including a low impedance variable direct current power supply 17, a variable resistance 18, a direct current ammeter 20 and a switch 22. The variable direct current supply may be a set of batteries with several terminals, a direct current generator, a potentiometer across the direct current source or the like. The power supply terminal voltage is adjustable over a range including the maximum forward voltage of switch device 10 in the blocking state and is capable of supplying a range of load current including the rated load current of the switch device 10. The resistor 18 is provided for adjusting the load current. A direct current voltmeter 24 is connected across the power supply 17 to indicate its terminal voltage. When the switch 22 is closed and the switch device 10 is in the blocking state, the anode-cathode resistance of the switch device 10 is so much higher than the resistance of adjustable resistor 18 and other resistance in the circuit that the voltmeter 24 indicates essentially the anode-cathode forward voltage of switch device 10 during the blocking state.

A circuit branch 26 for switching the device 10 between blocking state and conducting state is connected between cathode and gate terminals 14 and 16. The voltage and current for gating on the switch device is very low compared to the voltage and current required for gating off the switch device. On the other hand, the voltage and current for gating off the switch device is far too high for gating on the switch device and would probably destroy the device. Therefore, gating-on voltage and current is supplied through transformer 28, and gating off voltage is supplied through transformers 28 and 30 in combination. A potentiometer 31 is connected across the secondary of transformer 30. A standard meter resistor 32 is connected in series with the gate terminal 16; a commercial unidirectional peak reading meter, e.g., Ballantine Model 305A, is connected across resistor 32 to register the peak amplitude of the turn-off current supplied to the switch device 10. A diode 36 is connected to decouple transformer 30 when turn-on voltage and current are supplied to the gate-cathode of switch device 10, and a resistor 38, connected in shunt with the combination of the secondary of transformer 30 and the diode 36 limits the turn-on current. A unidirectional peak reading meter 40 similar to meter 34 registers the turn-off voltage. The secondaries are energized in phase as indicated by the polarity markings.

When the right hand end of the secondaries is positive, the diode 36 decouples the transformer 30 from the gate-cathode circuit and the secondary of transformer 28 supplies turn-on voltage and current. When the right-hand end of the secondaries is negative, the secondary of the transformer 28 is in series with the tap of potential 31 and the sum of their voltages appear across terminals 14 and 16, for supplying turn-off voltage and current to the switch device 10. If the primaries are connected to an alternating current, 60 cycle, power supply and the voltages supplied by the secondary of transformer 28 and the potentiometer 31 across the secondary of transformer 30 are sufficient for switching, the device 10 is switched on and off 60 times per second. The rise time of the gating signal is repetitive, and while not linear, is approximately constant for a range of turn-off signal amplitude.

The circuit in FIG. 1 is operated as follows: Prior to connecting the switch device 10 to the circuit, the direct current supply is adjusted until the terminal voltage is equal to the maximum or rated forward voltage of the switch device 10 in the blocking state. The resistor 18 is set at maximum resistance and the potentiometer 31 is set at the lower voltage end. Then transformers 28, 30, and 50 are energized. Since the turn-on voltage supplied by transformer 28 is sufficient to switch the device 10 from the blocking state to the conducting state and since the turn-off voltage is not sufficient for switching the device 10 back to the blocking state, continuous direct current flows through the switch device 10. The resistor 18 is adjusted until the ammeter 20 registers the selected level of load current to be switched, which may be the rated current or any other current level. Then the potentiometer 31 is adjusted to raise the turn-off voltage gradually until the peak meter 40 registers a jump in voltage and the ammeter 20 registers a drop in current. This indicates that the turn-off voltage and current has been raised above the level required for switching. The meter 34 indicates the switching current. To find the turn-off voltage precisely, the potentiometer 31 is adjusted both ways to zero in on the level of turn-off voltage just below the switching level.

FIGS. 3 and 4 are shown graphically one pulse of turn-off current and one pulse of turn-off voltage when the device 10 is switched off. At the instant of switching the current drops due to increased gate-cathode impedance in the switch device. If switching is continuous, e.g. 60 times per second, the peak meter 34 will register the peak current level shown in FIG. 3, which is the turn-off current level, even if the voltage is substantially higher than the level required for switching. At the instant of switching the gate cathode voltage peaks, the amplitude of the peak being related to the internal impedance of the turn-off voltage source. Since the meter 40 registers the peak voltage rather than the turn-off switching voltage, it is necessary to zero in on the turn-off switching voltage carefully to minimize the peak or to register the voltage level just below the turn-off switching voltage. With due regard to practical considerations, it is advantageous to use a trigger signal source having as little internal impedance as possible to minimize the peaking effect. Another method of registering the turn-off voltage and the turn-off current is to connect an oscilloscope in place of meter 34 or meter 40. The oscilloscope will display the curves shown in FIGS. 3 and 4. The turn-off voltage and current can be read off the oscilloscope display. The meter 54 indicates the forward leakage current. An oscilloscope or peak meter may be substituted for meter 54.

Turn-on voltage and current may be measured in a manner similar to that described above if a potentiometer is connected across the secondary of transformer 28 or if resistor 38 is replaced by an adjustable resistor, and if connections of the unidirectional peak meters 34 and 40 are reversed.

The potentiometer 31 across the secondary is merely illustrative of one of several arrangements suitable for the purpose. A Variac type device or adjustment means in the primary circuit may be used. Additionally, pulse circuitry, e.g. a flip-flop and cathode follower may be used in place of transformers 28 and 30. No adjustment means corresponding to potentiometer 31 is shown across the secondary of transformer 28 because one level of turn-on voltage and turn-on current is suitable for a variety of types and ratings of the switch device 10. If turn-on voltage and turn-on current are to be measured or if there is need to vary turn-on voltage and current to extend the range of the circuit, including an adjustment device such as potentiometer 31 to the transformer 28 is contemplated with the scope of this invention.

The anode-cathode circuit includes means 42 for measuring forward leakage current connected in parallel with the switch 22 and its connecting leads and having a deactivating switch 44. When switch 22 is open and switch 44 is closed, the forward leakage current measuring means is operable. The forward leakage measuring means includes two parallel circuit branches, one of which has very low impedance relative to the other when the switch device is in the conducting state and which has very high impedance relative to the other branch when the switch device is in the blocking state. The branch that changes impedance with the conducting and blocking states includes a controlled rectifier 46 connected to conduct in the same direction as the switch device 10. The gating circuit for the controlled rectifier includes a resistor 48 and the secondary of a transformer 50 energized in phase with the secondaries of transformers 28 and 30. In order that the controlled rectifier not be gated-on any later than the switch device 10, the resistor 48 is smaller than resistor 38 or the voltage output of the secondary of transformer 50 is greater than the voltage output of the secondary of transformer 28, or both. The controlled rectifier is returned to the blocking state when the switch device 10 is turned off.

The forward leakage current is measured by the circuit branch including low voltage battery 52, microammeter or milliammeter 54 and rectifier 56 in parallel with the controlled rectifier, when the controlled rectifier is in the blocking state. The low voltage battery is connected in opposition to the power supply 17. When the controlled rectifier is in the conducting state, the voltage drop thereacross is very low and it shortcircuits the other circuit branch. The battery voltage may be on the order of three volts. The rectifier prevents battery 52 from supplying any loop current through the controlled rectifier when the latter is in the conducting state. When the switch device 10 is turned off, forward leakage current flows through the battery 52 and meter 54. Generally, leakage current is measured at rated forward voltage to be significant. Therefore, the terminal voltage of power supply 17 is adjusted generally for rated forward voltage, taking into account the opposing voltage of battery 52.

In order for the circuit to function properly, the outputs of the secondaries of transformers 28, 30, and 50, which change polarity periodically when energized by an alternating current power supply, must be in phase and polarized with respect to each other as shown by the plus and minus markings in FIG. 1.

While the triggering signals for the controlled rectifier and the switch device are described above as a 60 cycle sinusoidal supply, the triggering signals may be square waves or other pulses having predetermined rapid rise time that is linear. However, for simplicity and economy, sinusoidal signal energy is satisfactory in most cases.

The embodiment shown in FIG. 2 is generally similar to the one shown in FIG. 1, except that the former includes two power supplies 60 and 62 for the load current and for the forward voltage, respectively. The supply 60 is a low voltage, e.g. 5–10 volts, high current source and the supply 62 is a comparatively high voltage supply. The forward voltage supply 62 is adjustable and its terminal voltage is indicated by the voltmeter 24'. A switch device 64 similar to the switch device 10' is connected in series with the forward voltage supply 62 and includes a gate circuit having a resistor 67 and the secondary of a transformer 68 which is polarized relative to the other transformer secondaries. The power supplies 60 and 62 are connected in opposition. A rectifier 66 is connected in series with the lower voltage supply so that it presents a high impedance to the supply 62. When the switch device 10' is turned off, the switch device 64 is turned on and rated forward voltage or other selected voltage is applied during the intervals that the switch device 10' is in the blocking state. Forward leakage current is measured as in FIG. 1.

For situations where high power consumption is a problem, such as life testing, the circuit shown in FIG. 2 is recommended. For this circuit it is advantageous if the triggering signals are pulses or square waves it enables the tests to be made with conduction and blocking angles of 180° degrees, when direct current meter 54 will read one-half the peak value. The advantage of this expedient is that a direct current meter costs a fraction of a peak meter or oscilloscope.

This circuit, like the one in FIG. 1, will provide accurate measurements of forward leakage current but the turn-off voltage and current obtained with this circuit will differ from the turn-off voltage and current obtained with the circuit in FIG. 1. Although the same load current is switched off, in FIGS. 1 and 2, the load current in FIG. 2 is supplied by a lower supply voltage; higher voltage and current is required for turning off a specific current supplied by a higher voltage source. Therefore, the circuit of FIG. 1 is recommended for measuring turn-off voltage and current for turning off a specific load current supplied from a comparatively high voltage source.

It will be understood that various changes in the details, materials and arrangements of parts (and steps), which have been herein described and illustrated in order to explain the nature of the invention, may be made by those skilled in the art within the principle and scope of the invention as expressed in the appended claims.

I claim:

1. A test circuit for determining operating parameters of a gate turn-off solid state switch device having an anode, a cathode, and a gate comprising:

(A) an anode terminal, a cathode terminal and a gate terminal for connection to the respective elements of the switch device, (B) an adjustable terminal voltage direct current power supply, a variable resistance, a direct current ammeter, and the anode and cathode elements of a controlled rectifier connected in series with said anode and cathode terminals, (C) means connected to the gate and cathode terminals for cyclically supplying turn-on and turn-off switching impulses, (D) said means being adjustable to selectively vary the amplitudes of the impulses, (E) means connected between gate and cathode of the controlled rectifier for switching on said controlled rectifier at the same time the switch device is turned on, (F) a unidirectional peak reading meter connected in series with said gate terminal for registering gate-cathode current for switching said device from one state to the other state, (G) a undirectional peak voltmeter connected between gate and cathode terminals for registering gate-cathode voltage for switching from one state to the other state, (H) a circuit path for leakage current connected in parallel with the anode and cathode terminals of the controlled rectifier and including, in series, means for registering leakage current, a diode for blocking current flow in said circuit path in the direction opposite to current flow through the controlled rectifier when gated on, and a low impedance direct current source having terminal voltage greater than the voltage drop across the controlled rectifier when load current flows therethrough, for opposing flow of current through said circuit path when the controlled rectifier is in the conductive state.

2. A test circuit for a gate turn-off solid state switch device having an anode, a cathode and a gate comprising:

(A) an anode-cathode circuit having terminals for connection to anode and cathode, respectively, for supplying a selected level of load current when the switch device connected to the anode and cathode terminals is in the conducting state and for applying a selected no load voltage between the anode and cathode terminals, said anode-cathode circuit including two parallel paths, one of said paths being operable during the conducting state of the switch device to present much lower impedance to load current than the other parallel path and being operable during the blocking state of the switch device to present much higher impedance to leakage current than the other parallel path, and said other parallel path including leakage current registering means, (B) and a gate-cathode circuit having terminals for connection to gate and cathode for applying turn-on voltage between the gate and cathode terminals and for supplying turn-on current to a switch device connected to said terminals and for applying selectively adjustable turn-off voltage between the gate and cathode terminals and for supplying turn-off current to the switch device connected to said terminals.

3. A test circuit for a gate turn-off solid state switch device having an anode, a cathode, and a gate comprising:

(A) an anode-cathode circuit having terminals for connection to anode and cathode respectively and including means for supplying an adjustable level of load current when the switch device connected to the anode and cathode terminals is in the conducting state and including another means for applying a selected no load voltage between the anode and cathode terminals when the switch device connected to the anode and cathode terminals is in the blocking state, (B) said anode-cathode circuit further including two parallel paths wherein one of the paths is operable during the conducting state of the switch device to present much lower impedance to load current than the other path and is operable during the blocking state of the switch device to present much higher impedance to leakage current than the other path, (C) said other path including leakage current measuring means, (D) a gate-cathode circuit having terminals for connection to gate and cathode for applying turn-on voltage between the gate and cathode terminals and for supplying turn-on current to the switch device connected to said terminals and for applying selectively adjustable turn-off voltage between the gate and cathode terminals, and for supplying turn-off current to the switch device connected to said terminals, (E) said gate cathode circuit including means for registering the minimum peak turn-off voltage and current.

References Cited by the Examiner

UNITED STATES PATENTS 2,154,379 4/1939 Estes ---------------- 324—28

OTHER REFERENCES

G.E. SCR Manual (second edition), Copyright December 1961, pp. 235–238.

RUDOLPH V. ROLINEC, *Primary Examiner.*

WALTER L. CARLSON, *Examiner.*

E. L. STOLARUN, *Assistant Examiner.*